(12) United States Patent
Zhou

(10) Patent No.: US 11,177,149 B2
(45) Date of Patent: Nov. 16, 2021

(54) WAFER JIG WITH IDENTIFICATION MARK

(71) Applicant: DISCO CORPORATION, Tokyo (JP)

(72) Inventor: Zhong Zhou, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 576 days.

(21) Appl. No.: 16/010,736

(22) Filed: Jun. 18, 2018

(65) Prior Publication Data

US 2018/0374729 A1 Dec. 27, 2018

(30) Foreign Application Priority Data

Jun. 23, 2017 (JP) .............................. JP2017-123395

(51) Int. Cl.
*H01L 21/67* (2006.01)
*H01L 23/544* (2006.01)

(52) U.S. Cl.
CPC .. *H01L 21/67294* (2013.01); *H01L 21/67092* (2013.01); *H01L 21/67253* (2013.01); *H01L 23/544* (2013.01); *H01L 2223/54493* (2013.01)

(58) Field of Classification Search
CPC ............. H01L 21/67294; H01L 23/544; H01L 2223/54493
USPC .................................................. 257/E23.179
See application file for complete search history.

(56) References Cited

U.S. PATENT DOCUMENTS

| | | | |
|---|---|---|---|
| 6,085,967 A * | 7/2000 | Grande | H01L 21/68 228/123.1 |
| 9,123,797 B2 * | 9/2015 | Sekiya | H01L 21/78 |
| 2003/0003608 A1 * | 1/2003 | Arikado | H01L 23/544 438/14 |
| 2015/0079734 A1 * | 3/2015 | Zuo | H01L 23/544 438/113 |

FOREIGN PATENT DOCUMENTS

JP 2005045033 A 2/2005

* cited by examiner

*Primary Examiner* — Mahdi H Nejad
(74) *Attorney, Agent, or Firm* — Greer Burns & Crain, Ltd.

(57) ABSTRACT

Disclosed herein is a wafer jig with an identification mark for use in inspecting the function of an identification mark reading mechanism for reading an identification mark on a device wafer. The wafer jig includes a wafer piece cut from a region of a device wafer where an identification mark is formed, and a circular plate having the same diameter as the device wafer. The wafer piece is fixed to the circular plate such that the identification mark on the wafer piece is positionally aligned with the identification mark on the device wafer.

7 Claims, 9 Drawing Sheets

WAFER JIG WITH IDENTIFICATION MARK

BACKGROUND OF THE INVENTION

Field of the Invention

The present invention relates to a wafer jig with an identification mark for use in inspecting the function of an identification mark reading mechanism for reading an identification mark on a device wafer.

Description of the Related Art

Various wafers made of silicon, SiC, sapphire, etc. from which to fabricate various devices including semiconductor devices and optical devices such as light-emitting diodes (LEDs) or the like have identification marks in the form of characters and bar codes disposed in the vicinity of peripheral edges of face or reverse sides of the wafers, for identifying dimensional information representing device types, wafer thicknesses, street intervals, and so on and information representing processing conditions and so on.

Identification marks on wafers are read by identification mark reading mechanisms installed in respective processing apparatus, and are used to confirm what kinds of wafers have been introduced into the processing apparatus (see, for example, Japanese Patent No. 4342861). Various different identification marks are formed at various different places on wafers depending on the types of wafer products. Therefore, the identification mark reading mechanisms in the processing apparatus are required to have their illumination, etc. adjusted in advance for reliably reading identification marks.

It has been customary for manufacturers of processing apparatus to inspect identification mark reading mechanisms by carrying out a readout test for actually reading an identification mark formed on a wafer with the identification mark readers of the identification mark reading mechanisms. After having inspected the identification mark reading mechanisms, the manufacturers ship the processing apparatus incorporating the inspected identification mark reading mechanism to their customers, so that the processing apparatus delivered to the customers will be prevented from suffering an identification mark readout failure.

SUMMARY OF THE INVENTION

However, since the processing apparatus manufacturers are not wafer manufacturers, it is not easy for the former manufacturers to obtain various different kinds of wafers. Wafers may possibly be broken at the time the processing apparatus manufacturers adjust identification mark reading mechanisms which they have manufactured. It is thus difficult for the processing apparatus manufacturers to keep various wafers with various types of identification marks available at all times.

It is therefore an object of the present invention to provide a wafer jig with an identification mark that can be used in adjusting an identification mark reading mechanism.

In accordance with an aspect of the present invention, there is provided a wafer jig with an identification mark for use in inspecting a function of an identification mark reading mechanism for reading an identification mark on a device wafer, including a wafer piece cut from a region of a device wafer where an identification mark is formed, and a circular plate having the same diameter as the device wafer. The wafer piece is fixed to the circular plate such that the identification mark on the wafer piece is positionally aligned with the identification mark on the device wafer.

Preferably, the wafer piece should include a notch defined therein which represents crystal orientation of the device wafer. Preferably, the wafer jig should further include a plurality of wafer pieces fixed to the circular plate, the respective wafer pieces carrying different identification marks formed thereon.

The wafer jig with the identification mark according to the present invention can be used to adjust the identification mark reading mechanism and a processing apparatus for delivering a wafer to the identification mark reading mechanism, as is the case with a device wafer having an identification mark. The wafer jig with the identification mark is thus able to achieve the same advantages as if gained from retaining precious wafers with identification marks without running the risk of damaging those precious wafers with identification marks.

If identification marks are separated individually from a plurality of kinds of dummy wafers and applied to a single circular plate, then the single circular plate with the applied identification marks can be used in the same manner as the kinds of dummy wafers, with efficiency and increased inspection reliability.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
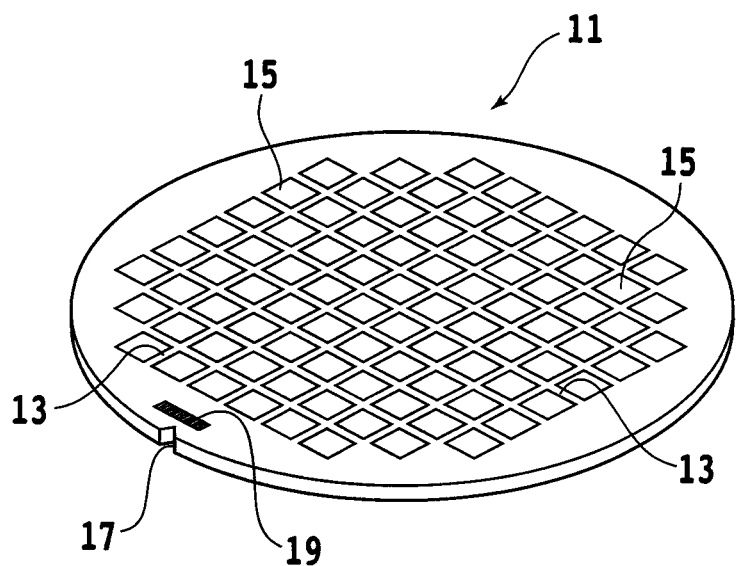
FIG. 1A is a perspective view of a device wafer with an identification mark.

Preferred embodiments of the present invention will be described in detail below with reference to the accompanying drawings. FIG. 1A depicts in perspective a device wafer 11 with an identification mark. As depicted in FIG. 1A, the device wafer 11 includes a semiconductor wafer typically made of silicon and has devices 15 such as integrated circuits (ICs), large scale integration (LSI) circuits, and so on formed in respective areas demarcated by a grid of projected dicing lines or streets 13 on a face side of the device wafer 11.

The device wafer 11 has a notch 17 defined in an outer peripheral edge thereof and representing the crystal orientation of the device wafer 11. An identification mark or ID mark 19 is disposed on the face side of the device wafer 11 adjacent to the notch 17. The identification mark 19 is in the form of numerals, characters, a bar code, or a combination thereof. The identification mark 19 serves to identify the type of the devices 15 and information of the device wafer 11. Device wafers 11 from one lot are assigned identical identification marks 19.

Figure 1B:
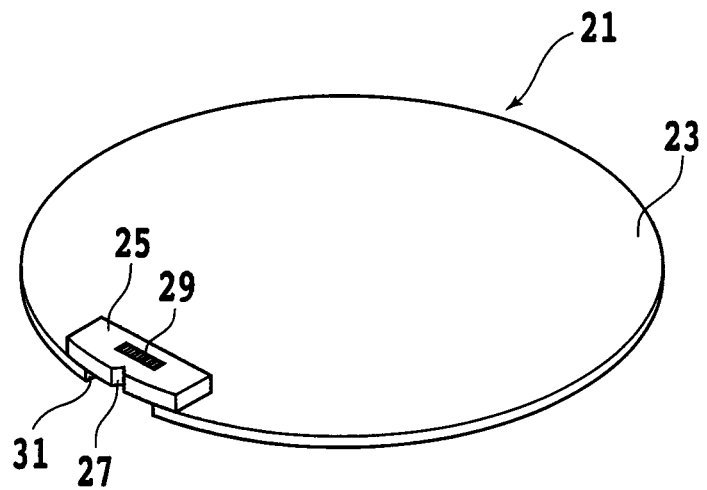
FIG. 1B is a perspective view of a wafer jig with an identification mark according to a first embodiment of the present invention.

FIG. 1B depicts in perspective a wafer jig 21 with an identification mark according to a first embodiment of the present invention. The wafer jig 21 includes a circular plate 23 having the same diameter as the device wafer 11 and a wafer piece 25 bonded to the circular plate 23, the wafer piece 25 being cut from a region of a device wafer 11 where an identification mark 19 is formed. The wafer piece 25 has a notch 27 that is the same as the notch 17 in the device wafer 11 and carries an identification mark 29 that is identical to the identification mark 19 on the device wafer 11. The circular plate 23 has a recess 31 defined in an outer peripheral region thereof which positionally corresponds to the notch 27 in the wafer piece 25. The recess 31 allows the notch 27 of the wafer jig 21 to be detected by a crystal orientation detecting unit to be described later.

Various different identification marks 19 are formed at various different places on device wafers 11 depending on the types of wafer products. It has been customary for manufacturers of processing apparatus to inspect identification mark reading mechanisms by carrying out a readout test for actually reading an identification mark formed on a device wafer with the identification mark reading mechanisms in the processing apparatus. After having inspected the identification mark reading mechanisms, the manufacturers ship the processing apparatus incorporating the inspected identification mark reading mechanism to customers, so that the processing apparatus delivered to the customers will be prevented from suffering an identification mark readout failure.

Device wafers 11 may possibly be broken at the time the processing apparatus manufacturers adjust identification mark reading mechanisms which they have manufactured. It is thus difficult for the processing apparatus manufacturers to keep various wafers with various types of identification marks available at all times. According to the present invention, an inventory is made available of many different wafer jigs 21 with identification marks which include circular plates 23 combined with respective wafer pieces 25 that carry many different types of identification marks 29 imaginable. Before processing apparatus are shipped to customers, the different types of identification marks 29 on the different wafer jigs 21 are read by the identification mark reading mechanisms in the processing apparatus, thereby inspecting the identification mark reading mechanisms. After having thus inspected the identification mark reading mechanisms, the processing apparatus manufacturers ship the processing apparatus to the customers.

An identification mark reading mechanism 20 incorporated in a cutting apparatus 2 depicted in FIG. 2, and a process of inspecting the identification mark reading mechanism 20 by having the identification mark reading mechanism 20 read the identification mark 29 on the wafer piece 25 bonded to the wafer jig 21 will be described below.

Figure 2:
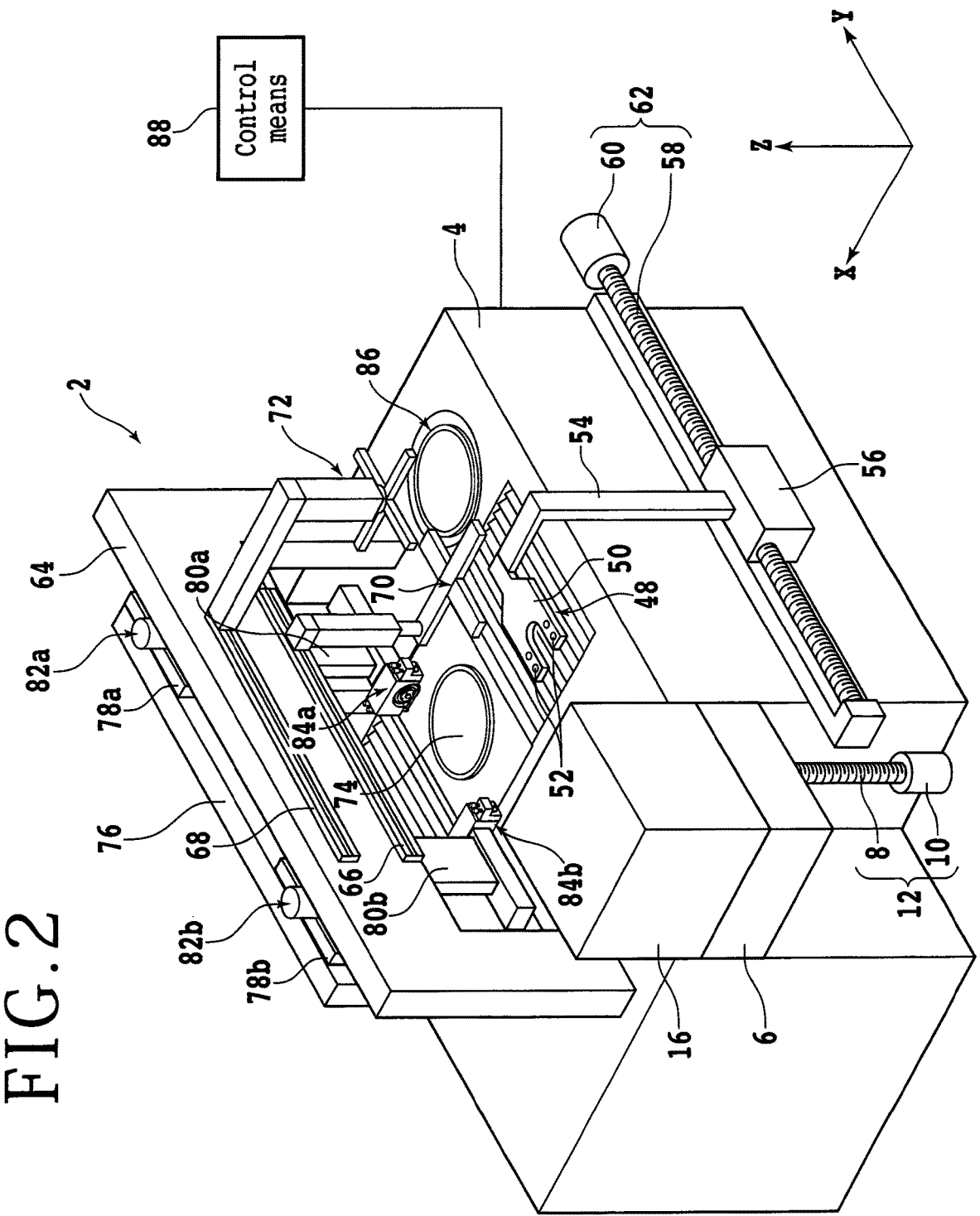
FIG. 2 is a perspective view of a cutting apparatus that is suitable for use with the wafer jig with the identification mark.

The cutting apparatus 2 depicted in FIG. 2 includes a cutting apparatus for half-cutting or trimming a wafer, rather than a cutting apparatus for dicing a wafer. As depicted in FIG. 2, the cutting apparatus 2 includes a base 4 and a cassette rest table 6 vertically movably disposed adjacent to the base 4. The cassette rest table 6 is shaped as a box having an opening 7 (see FIG. 3) therein, and is supported on a support 14 that extends downwardly and has an integral engaging arm 14a at its lower end which incorporates therein a nut threaded over a vertical ball screw 8. The ball screw 8 and a stepping motor 10 coupled to a lower end of the ball screw 8 jointly make up a cassette rest table moving mechanism 12.

A cassette 16 having a vertical array of rest shelves 18 is placed on the cassette rest table 6. Although not depicted, the cassette 16 houses therein a plurality of wafer jigs 21 with identification marks, which have both sides supported on the respective rest shelves 18. The cassette rest table 6 has a bottom wall 6a, an upper wall 6b, and a rear wall 6c, with the opening 7 defined in a front wall thereof. A central table 22 that is rotatable about its own axis is disposed in the cassette rest table 6 above the bottom wall 6a. The central table 22 can be rotated about its own axis by a stepping motor 24 mounted on the bottom wall 6a.

Figure 6:
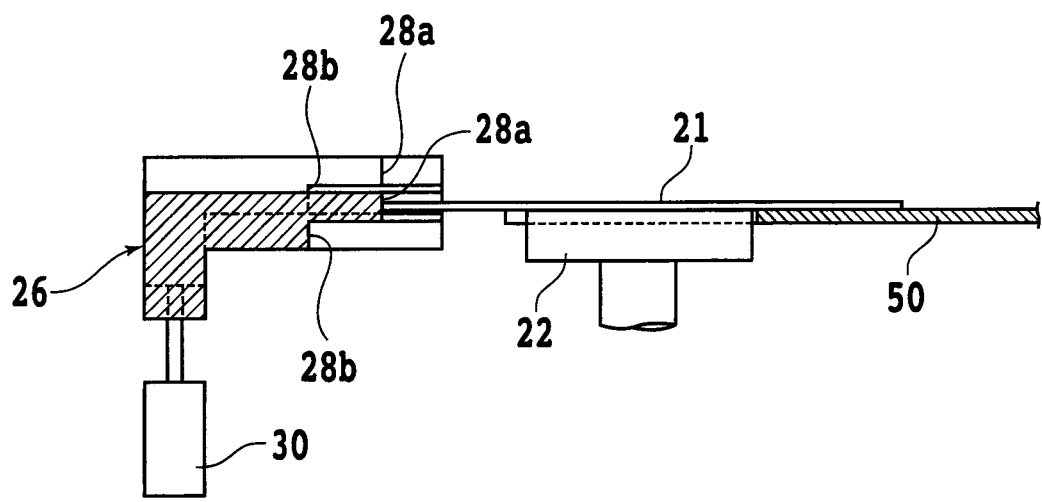
FIG. 6 is a cross-sectional view of a portion of the identification mark reading mechanism.
Figure 6:
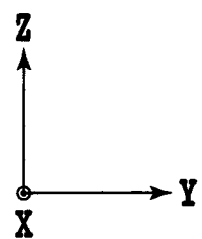
Figure 7:
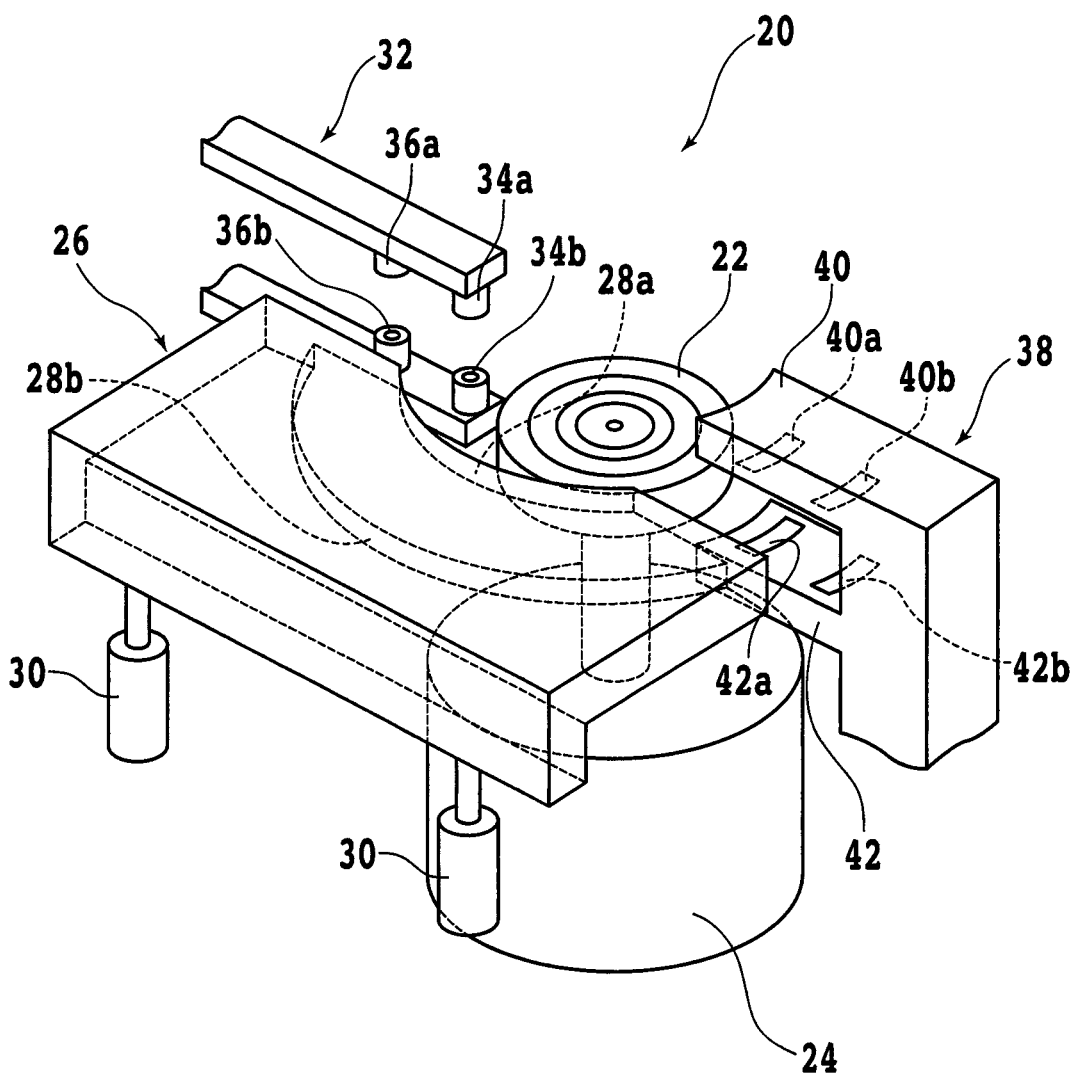
FIG. 7 is a perspective view of the identification mark reading mechanism.

A centering member 26 is disposed above the bottom wall 6a closely to the rear wall 6c of the cassette rest table 6. As best depicted in FIG. 7, the centering member 26 is vertically movable by an air cylinder 30. As depicted in FIGS. 6 and 7, the centering member 26 has two upper and lower arcuate surfaces 28a and 28b as positional limiters on the side thereof which faces the central table 22, for contacting an outer peripheral surface of the wafer jig 21 with the identification mark.

The arcuate surface 28a, which is positioned as an upper arcuate surface 28a above the other arcuate surface 28b, is shaped to match the radius of an 8-inch device wafer, for example. The other arcuate surface 28b, i.e., a lower arcuate surface 28b, is shaped to match the radius of a 12-inch device wafer, for example. The positioning member 26 is disposed such that the arcuate surfaces 28a and 28b are concentric to the center of rotation of the central table 22.

As best depicted in FIG. 7, the identification mark reading mechanism 20 includes a crystal orientation detecting unit 32 for detecting the crystal orientation of the device wafer 11. The crystal orientation detecting unit 32 has a light-emitting element 34a and a light-detecting element 34b for use with an 8-inch device wafer, for example and a light-emitting element 36a and a light-detecting element 36b for use with a 12-inch device wafer, for example. The crystal orientation detecting unit 32 is positioned on one side of the central table 22. The identification mark reading mechanism 20 further includes an identification mark reader 38 positioned on the opposite side of the central table 22, i.e., positioned diametrically across the central table 22 from the crystal orientation detecting unit 32. The identification mark reader 38 includes a face-side reader 40 and a reverse-side reader 42.

The face-side reader 40 includes an 8-inch wafer reader 40a and a 12-inch wafer reader 40b, and the reverse-side reader 42 also includes an 8-inch wafer reader 42a and a 12-inch wafer reader 42b. The identification mark reader 38 thus constructed reads the identification mark 29 on the wafer jig 21 held on the central table 22 and enters read information into control means 88 depicted in FIG. 2.

Referring back to FIG. 2, the cutting apparatus 2 includes a first feed unit 48 including a hand 50 having a plurality of suction holes 52 defined in an upper surface thereof, an L-shaped support arm 54 that supports the hand 50 on an upper end thereof, and a Y-axis moving block 56 coupled to a lower end of the support arm 54. The Y-axis moving block 56 includes a nut therein that is threaded over a ball screw 58 mounted on a side wall of the base 4, the ball screw 58 being rotatable about its own axis and extending in Y-axis directions. The ball screw 58 and a stepping motor 60 coupled to an end of the ball screw 58 jointly make up a moving mechanism 62 for moving the first feed unit 48. When the stepping motor 60 is energized, the ball screw 58 is rotated about its own axis, moving the first feed unit 48 along one of the Y-axis directions.

The base 4 supports a first upstanding portal-shaped frame 64 on its upper wall. Two spaced parallel guide rails 66 and 68 that extend in the Y-axis directions are disposed on a front surface of the first upstanding portal-shaped frame 64. A second feed unit 70 is guided by the guide rail 66 for movement along the Y-axis directions, and is also movable vertically along Z-axis directions. A third feed unit 72 is guided by the guide rail 68 for movement along the Y-axis directions, and is also movable vertically along Z-axis directions. A chuck table 74 for holding a workpiece under suction thereon is rotatably mounted substantially centrally on the upper wall of the base 4. The chuck table 74 is movable along the X-axis directions.

A second upstanding portal-shaped frame 76 is mounted on the upper wall of the base 4 behind the first upstanding portal-shaped frame 64. A first Y-axis moving block 78a and a second Y-axis moving block 78b are disposed on the second upstanding portal-shaped frame 76 for independent movement along the Y-axis directions. A first Z-axis moving block 80a is mounted on the first Y-axis moving block 78a and is movable in the Z-axis directions by a first Z-axis moving mechanism 82a. A second Z-axis moving block 80b is mounted on the second Y-axis moving block 78b and is movable in the Z-axis directions by a second Z-axis moving mechanism 82b. A first cutting unit 84a having a cutting blade is disposed on a distal end of the first Z-axis moving block 80a, whereas a second cutting unit 84b having a cutting blade is disposed on a distal end of the second Z-axis moving block 80b.

The cutting apparatus 2 further includes a spinner cleaning unit 86 disposed on the upper wall of the base 4. A workpiece that has been cut by the first cutting unit 84a and/or the second cutting unit 86b is delivered by the third feed unit 72 to the spinner cleaning unit 86, where the workpiece is spin-cleaned and spin-dried. The various components of the cutting apparatus 2 are controlled in operation by the control means 88.

Figure 3:
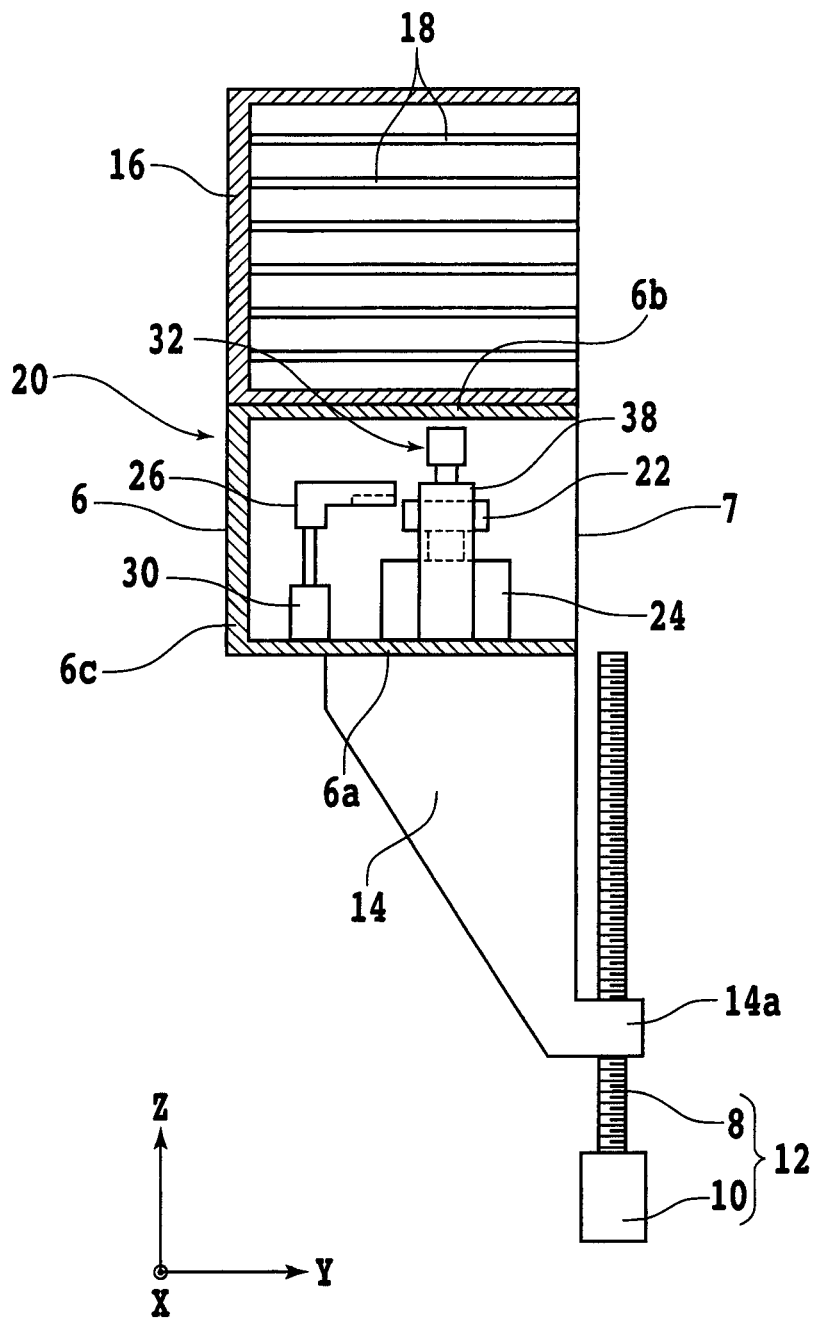
FIG. 3 is a vertical cross-sectional view of an identification mark reading mechanism and a cassette.
Figure 4:
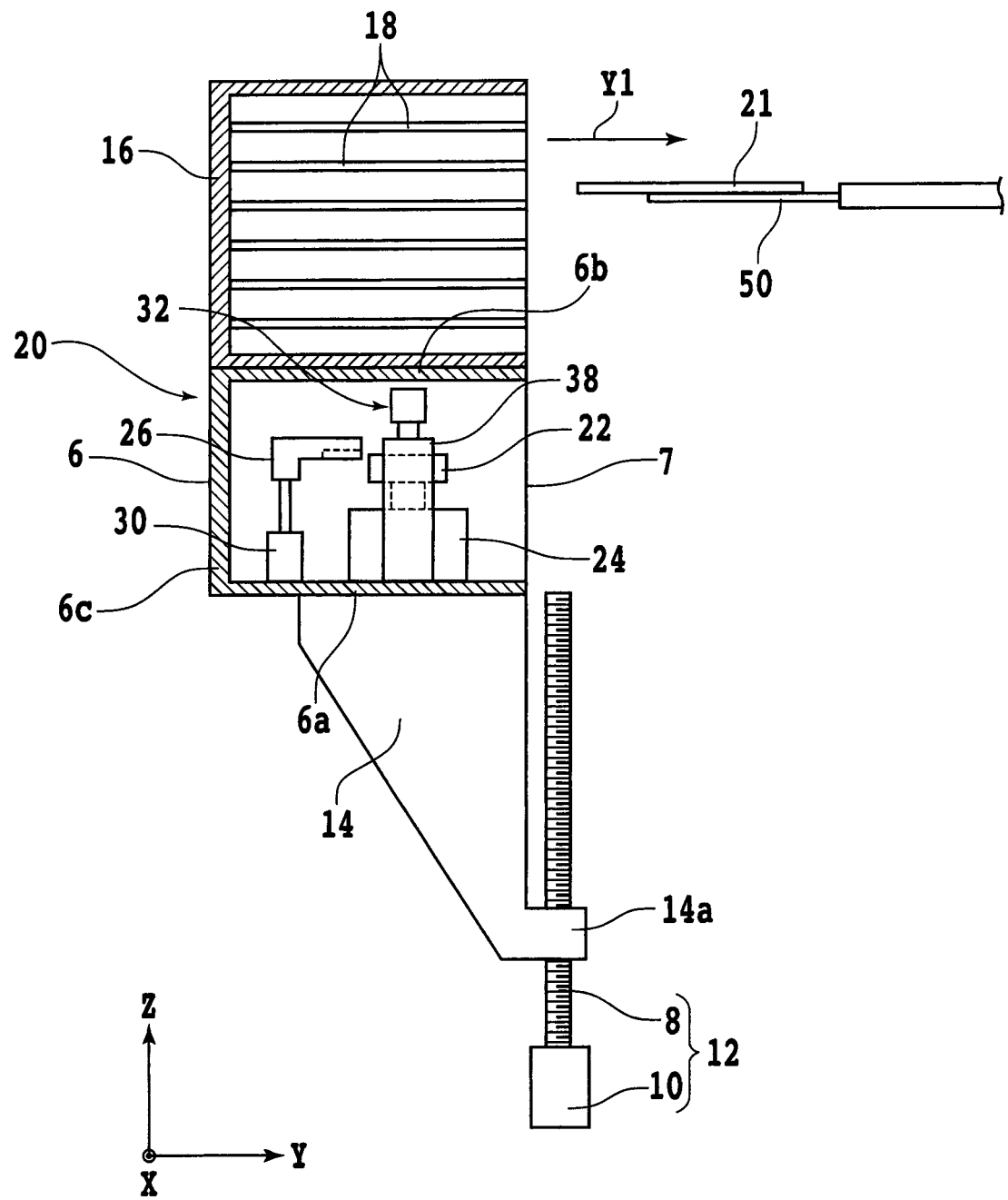
FIG. 4 is a side elevational view, partly in cross section, depicting the manner in which a wafer jig with an identification mark is taken out of the cassette.
Figure 5:
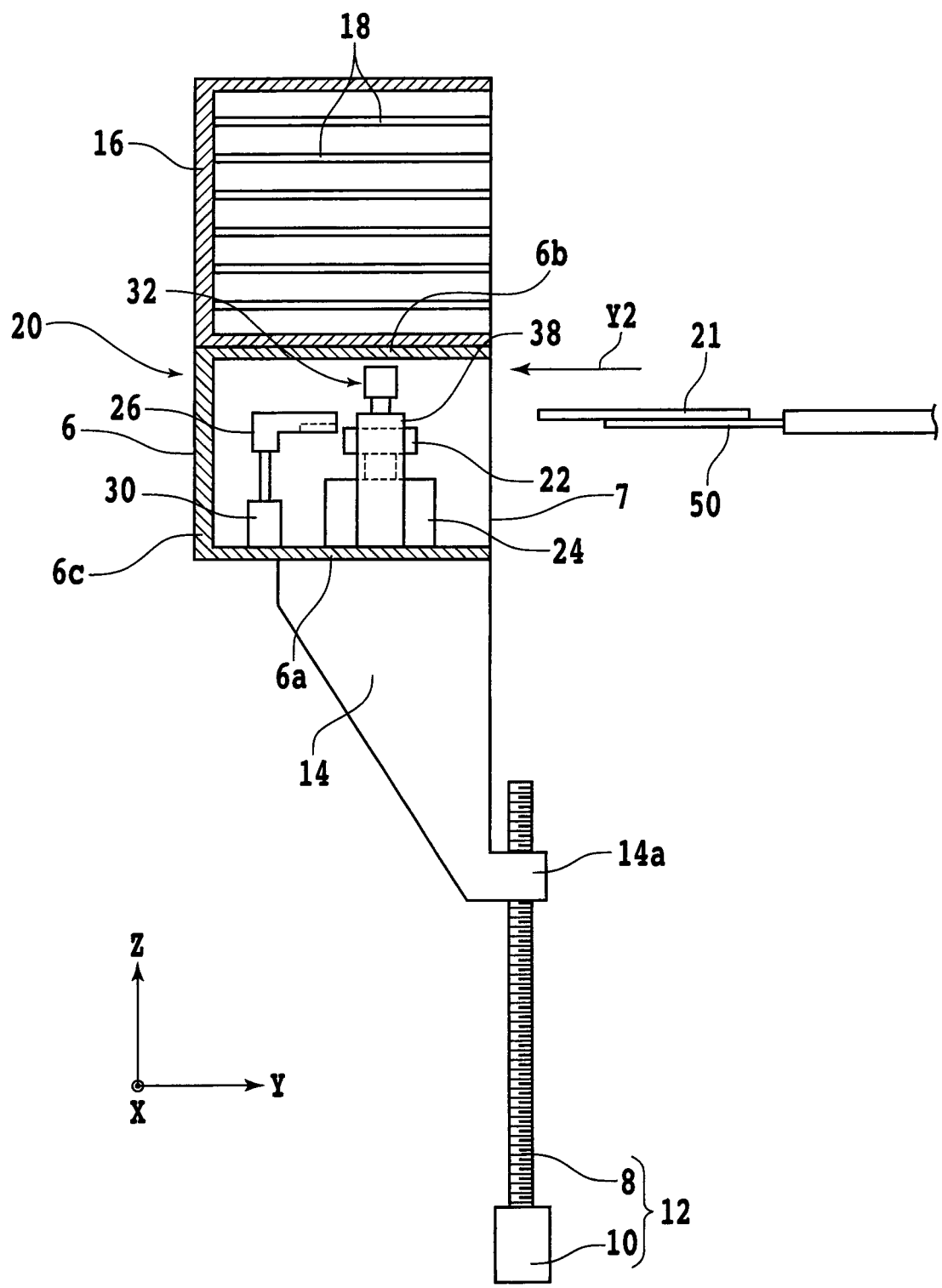
FIG. 5 is a side elevational view, partly in cross section, depicting the manner in which a wafer jig with an identification mark is introduced into the identification mark reading mechanism that is housed in a cassette rest table.

Although not depicted in FIGS. 3 through 5, the cassette 16 houses therein a plurality of wafer jigs 21 with identification marks, which are supported on the respective rest shelves 18. A process of confirming operation of the identification mark reading mechanism 20 using the wafer jig 21 with the identification mark before the cutting apparatus 2 is shipped to a customer will be described below.

FIG. 4 depicts in side elevation, partly in cross section, the manner in which the hand 50 of the first feed unit 48 holds the wafer jig 21 with the identification mark under suction and delivers the wafer jig 21 with the identification mark in a Y1 direction out of the cassette 16. Though the height of the hand 50 remains unchanged, when the stepping motor 10 of the cassette rest table moving mechanism 12 is energized, the cassette rest table 6 is vertically moved, so that the hand 50 can deliver one at a time of the wafer jigs 21 with the identification marks placed on the rest shelves 18 out of the cassette 16.

After the hand 50 of the first feed unit 48 has held the wafer jig 21 with the identification mark under suction and delivered the wafer jig 21 with the identification mark in the Y1 direction out of the cassette 16, the stepping motor 10 of the cassette rest table moving mechanism 12 is energized to move the cassette rest table 6 to an elevated position, as depicted in FIG. 5. Then, the hand 50 of the first feed unit 48 is moved in a Y2 direction, inserting the wafer jig 21 with the identification mark through the opening 7 into the cassette rest table 6.

In the elevated position, since the hand 50 of the first feed unit 48 is vertically spaced from the central table 22, the insertion of the hand 50 is not obstructed by the central table 22. As the hand 50 is further inserted into the cassette rest table 6, as depicted in FIG. 6, the hand 50 grips the central table 22 and places the wafer jig 21 with the identification mark held on the upper surface of the hand 50 onto the central table 22.

At this time, an outer peripheral surface of the wafer jig 21 with the identification mark abuts against the arcuate surface 28a or 28b of the centering member 26, thereby centering the wafer jig 21 with the identification mark in axial alignment with the central table 22. Immediately before an outer peripheral surface of the wafer jig 21 with the identification mark abuts against the arcuate surface 28a or 28b of the centering member 26, the hand 50 releases the wafer jig 21 with the identification mark from its hold under suction. Once the wafer jig 21 has been centered, vacuum control means, not depicted, is operated to hold the wafer jig 21 with the identification mark under suction on the central table 22.

Then, the identification mark reading mechanism 20 performs a process of positioning the crystal orientation of the wafer jig 21 with the identification mark. Specifically, the stepping motor 24 of the identification mark reading mechanism 20 depicted in FIG. 7 is energized to rotate the central table 22 about its own axis. When the crystal orientation detecting unit 32, i.e., the light-emitting element 34a and the light-detecting element 34b or the light-emitting element 36a and the light-detecting element 36b that are disposed in a position matching the size of the wafer jig 21 with the identification mark, detects the notch 27 defined in the outer peripheral edge of the wafer jig 21 with the identification mark, the stepping motor 24 is de-energized to position the crystal orientation of the wafer jig 21 with the identification mark in alignment with a reference position.

After the crystal orientation of the wafer jig 21 with the identification mark has been positioned in alignment with the reference position, the stepping motor 24 is energized again to turn the central table 22 through 180 degrees, bringing the identification mark 29 into a position facing the identification mark reader 38. Specifically, if the identification mark 29 is formed on a face side of the 8-inch wafer jig 21, the 8-inch wafer reader 40a of the face-side reader 40 reads the identification mark 29, and if the identification mark 29 is formed on a face side of the 12-inch wafer jig 21, the 12-inch wafer reader 40b of the face-side reader 40 reads the identification mark 29.

On the other hand, if the identification mark 29 is formed on a reverse side of the 8-inch wafer jig 21, the 8-inch wafer reader 42a of the reverse-side reader 42 reads the identification mark 29, and if the identification mark 29 is formed on a reverse side of the 12-inch wafer jig 21, the 12-inch wafer reader 42b of the reverse-side reader 42 reads the identification mark 29.

Figure 8:
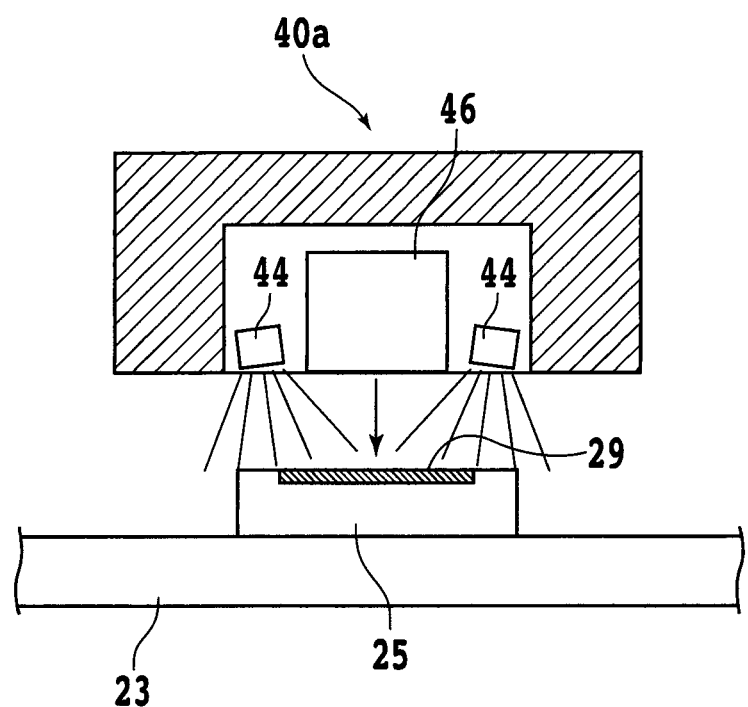
FIG. 8 is a cross-sectional view of an identification mark reader of the identification mark reading mechanism.

Structural details of the 8-inch wafer reader 40a of the face-side reader 40 and operation thereof will be described below with reference to FIG. 8. The 8-inch wafer reader 40a includes a camera 46 and two illuminating units 44 such as LEDs or the like disposed one on each side of the camera 46. While the illuminating units 44 are illuminating the identification mark 29 on the wafer piece 25, the camera 46 captures an image of the identification mark 29. The captured image is converted into an electric signal, which is supplied to the control means or controller 88 of the cutting apparatus 2. The control means 88 determines whether or not the image information of the captured image falls within a preset allowable range, and displays the determined result on a display, not depicted, of the cutting apparatus 2. The 12-inch wafer reader 40b, the 8-inch wafer reader 42a, and the 12-inch wafer reader 42b are constructed and operate in the same manner as the 8-inch wafer reader 40a.

Different wafer jigs 21 with different types of identification marks 29 are introduced one by one into the identification mark reading mechanism 20, and the identification mark reader 38 thereof reads the identification marks 29 one by one, whereupon the control means 88 determines whether or not the identification mark reading mechanism 20 operates properly with respect to the different types of identification marks 29. When all of the different types of identification marks 29 have been read, if all of the determined results from the control means 88 fall within a proper range, then the manufacturer of the processing apparatus ships the cutting apparatus 2 to its customer. If the identification mark reading mechanism 20 suffers even a single readout failure, then the identification mark reading mechanism 20 is adjusted until the determined result from the control means 88 falls within the proper range.

Figure 9:
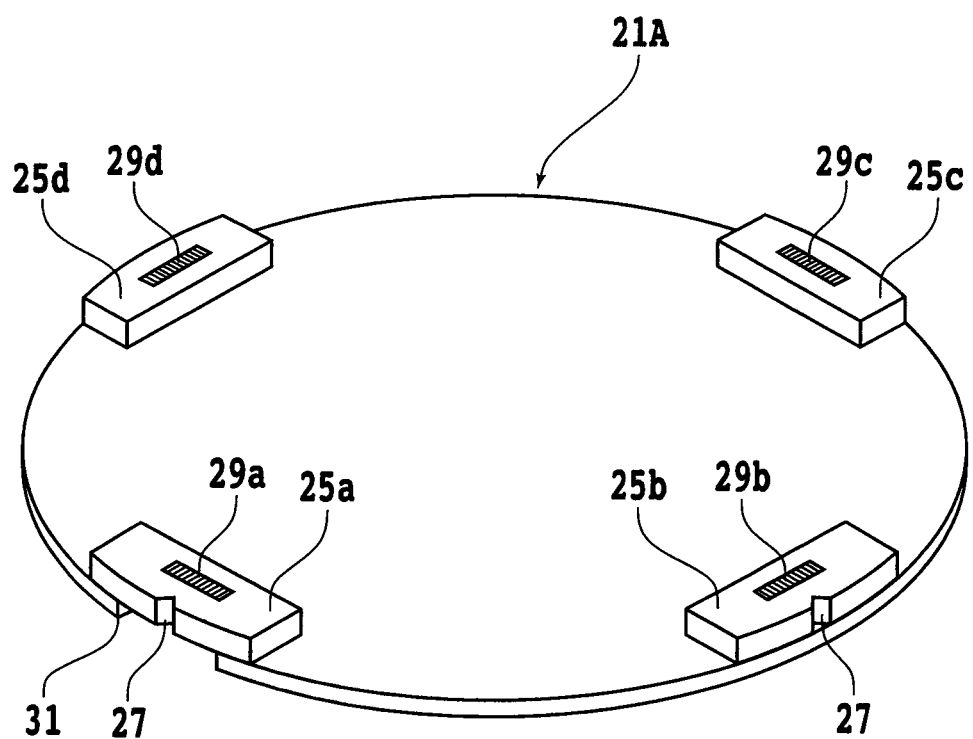
FIG. 9 is a perspective view of a wafer jig with identification marks according to a second embodiment of the present invention.

FIG. 9 depicts in perspective a wafer jig 21A with identification marks according to a second embodiment of the present invention. According to the second embodiment, the wafer jig 21A includes a circular plate 23 with four wafer pieces 25a, 25b, 25c, and 25d bonded thereto at angularly spaced positions on the outer periphery of the circular plate 23. The wafer pieces 25a, 25b, 25c, and 25d carry respective identification marks 29a, 29b, 29c, and 29d that are different from each other.

The wafer piece 25a has a notch 27 and is bonded to the circular plate 23 that has a recess 31 defined in an outer peripheral region thereof which positionally corresponds to the notch 27 in the wafer piece 25a. The wafer piece 25b also has a notch 27 and is bonded to the circular plate 23 that is free of a recess in an outer peripheral region thereof which positionally corresponds to the notch 27 in the wafer piece 25b. The other wafer pieces 25c and 25d are free of a notch. Therefore, only one of the wafer pieces 25a, 25b, 25c, and 25d has the notch 27 that positionally corresponds to the recess 31. In this manner, the notch 27 is prevented from suffering a readout error as it is only one notch that can be detected by the crystal orientation detecting unit 32. There exists a device wafer having an identification mark formed thereon at a position not positionally corresponding to a notch defined in an outer peripheral edge of the device wafer, e.g., at a position that is 180 degrees spaced circumferentially from the notch.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer jig, the wafer jig configured to be used during an inspection process of a mark reading mechanism said, wafer jig comprising:
    a wafer piece cut from a region of a device wafer where an identification mark is formed, whereby the wafer piece includes the identification mark, and wherein the device wafer includes a plurality of devices thereon and the identification mark is not in contact with any of the devices; and
    a circular plate having the same diameter as the device wafer,
    wherein the wafer piece is fixed to the circular plate at a location such that the identification mark on the wafer piece positionally corresponds with a previous location of the identification mark on the device wafer prior to having the wafer piece cut therefrom.

2. The wafer jig according to claim 1, wherein the wafer piece includes a notch defined therein which represents crystal orientation of the device wafer.

3. The wafer jig according to claim 1, further comprising:
    at least one additional wafer piece fixed to the circular plate, wherein each of the at least one additional wafer pieces carries an identification mark that is different from the identification mark of other ones of the wafer pieces.

4. The wafer jig according to claim 2, wherein the circular plate includes a recess therein that aligns with the notch on the wafer piece.

5. The wafer jig according to claim 1, wherein the identification mark identifies the type of devices on the device wafer prior to having the wafer piece cut therefrom, but the wafer piece lacks any devices thereon.

6. The wafer jig according to claim 1, wherein the wafer piece lacks any devices thereon.

7. The wafer jig according to claim 1, wherein the wafer piece includes a radially outer edge shaped as a portion of a circumference of a circle.

* * * * *